(12) United States Patent
Park (10) Patent No.: US 7,629,679 B2
(45) Date of Patent: Dec. 8, 2009

(54) SEMICONDUCTOR PACKAGE, MEMORY CARD INCLUDING THE SAME, AND MOLD FOR FABRICATING THE MEMORY CARD

(75) Inventor: Hee-Jin Park, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 316 days.

(21) Appl. No.: 11/286,314

(22) Filed: Nov. 23, 2005

(65) Prior Publication Data

US 2006/0118926 A1 Jun. 8, 2006

(30) Foreign Application Priority Data

Nov. 25, 2004 (KR) .................. 10-2004-0097596

(51) Int. Cl.
*H01L 23/02* (2006.01)
(52) U.S. Cl. .................. 257/679; 257/787; 257/701
(58) Field of Classification Search ............. 257/679, 257/787, 778, 723, 724, 790, 701
See application file for complete search history.

(56) References Cited

U.S. PATENT DOCUMENTS

| 5,894,410 | A * | 4/1999 | Barrow ............... 361/760 |
| 6,462,273 | B1 * | 10/2002 | Corisis et al. ........ 174/521 |
| 7,053,471 | B2 * | 5/2006 | Wada et al. ........... 257/679 |
| 7,055,757 | B2 * | 6/2006 | Nishizawa et al. ..... 235/492 |
| 7,234,644 | B2 * | 6/2007 | Nishizawa et al. ..... 235/492 |
| 7,291,903 | B2 * | 11/2007 | Nishizawa et al. ..... 257/679 |
| 2002/0109242 | A1 * | 8/2002 | Kasuga et al. ........ 257/787 |
| 2003/0227075 | A1 | 12/2003 | Kanemoto et al. |
| 2004/0029318 | A1 * | 2/2004 | Kazama ............... 438/127 |
| 2006/0157838 | A1 * | 7/2006 | Bolken ............... 257/678 |
| 2006/0220204 | A1 * | 10/2006 | Wada et al. .......... 257/679 |

FOREIGN PATENT DOCUMENTS

| JP | 2002-015296 | 1/2002 |
| KR | 2002-7576 | 1/2002 |

OTHER PUBLICATIONS

English language abstract of Korean Publication No. 2002-7576.
English language abstract of Japanese Publication No. 2002-015296.

* cited by examiner

*Primary Examiner*—S. V Clark
(74) *Attorney, Agent, or Firm*—Volentine & Whitt, PLLC

(57) ABSTRACT

A semiconductor package includes a printed circuit board, a semiconductor chip mounted on the printed circuit board, a wire structured to electrically connect the printed circuit board to the semiconductor chip, and an encapsulant that protects the semiconductor chip and the wire, the encapsulant disposed on the printed circuit board such that the encapsulant covers a surface of the printed in an edge region of the printed circuit board and exposes another surface of the printed circuit board in another edge region of the printed circuit board.

19 Claims, 7 Drawing Sheets

SEMICONDUCTOR PACKAGE, MEMORY CARD INCLUDING THE SAME, AND MOLD FOR FABRICATING THE MEMORY CARD

CROSS REFERENCE TO RELATED APPLICATIONS

This application claims foreign priority from Korean (KR) Patent Application No. 10-2004-0097596, filed on 25 Nov. 2004. Korean Patent Application No. 10-2004-0097596 is hereby incorporated by reference.

BACKGROUND

1. Technical Field

This disclosure relates to a semiconductor package, a memory card including the same, and a mold for fabricating the memory card, and more particularly, to a semiconductor package used to fabricate a memory card with high density at low manufacturing costs, a memory card including the same, and a mold for fabricating the memory card 2. Description of the Related Art As various electronic technologies are developed, increasing amounts of information can be stored in a single memory card. Memory cards are portable due to their small size and thickness. These advantages have led to a dramatic increase in the demand for memory devices. A memory card includes a plastic base card that has a semiconductor package in which a semiconductor chip is mounted on a printed circuit board. That is, the semiconductor chip is disposed on an inside surface of the printed circuit board, and pads are formed on an outside surface of the printed circuit board. The pads are used to electrically connect the memory card to a card terminal. The semiconductor chip is wire-bonded to a circuit interconnection formed on the inside surface of or on the printed circuit board, and the circuit interconnection is electrically connected to the pads. The semiconductor chip and the wire are encased by an encapsulant.

Figure 1:
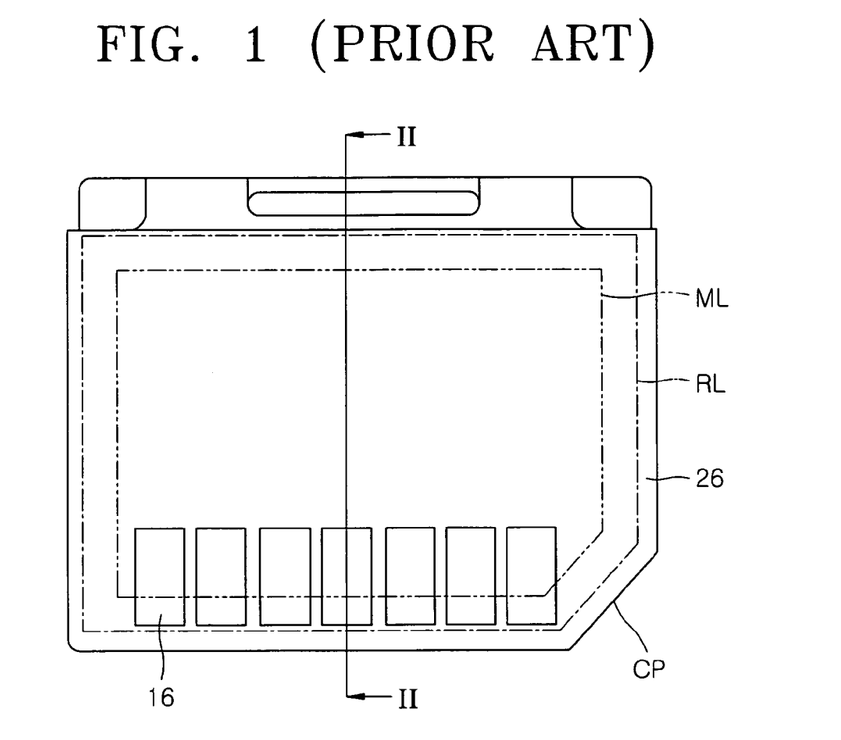
FIG. 1 is a plan diagram illustrating a conventional memory card.
Figure 2:
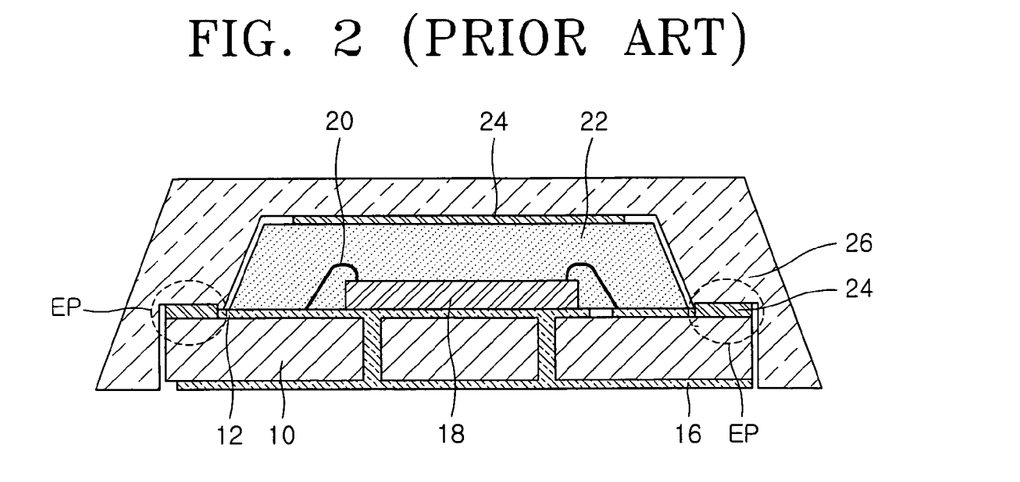
FIG. 2 is a sectional diagram taken along the line II-II in FIG. 1, further illustrating the conventional memory card of FIG. 1.

FIG. 1 is a plan diagram illustrating a conventional memory card. FIG. 2 is a sectional diagram taken along the line II-II in FIG. 1, further illustrating the conventional memory card of FIG. 1.

Referring to FIGS. 1 and 2, the conventional memory card includes a printed circuit board 10 and a semiconductor chip 18 mounted thereon. The semiconductor chip 18 is connected to the printed circuit board 10 via a circuit interconnection 12 formed on the surface of and through the printed circuit board 10 and via wires 20. A semiconductor package includes the semiconductor chip 18, the wires 20, and an encapsulant 22, such as a resin, formed on the printed circuit board 10.

The circuit interconnection 12 is connected to an external device (not shown) through a pad 16 formed on a lower surface of the printed circuit board 10. The semiconductor package, including the semiconductor chip 18 disposed on the printed circuit board 10, the wire 20, and the encapsulant 22, is adhered to a base card 26 by an adhesive 24.

The outer structure of the semiconductor package of the conventional memory card is formed when a printed circuit board including a chamfer portion CP is manufactured indicated by a line RL shown in FIG. 1. Therefore, the manufacturing costs for the printed circuit board are high.

The encapsulant 22 of the semiconductor package of the conventional memory card is disposed inside a line ML shown in FIG. 1, that is, inside the line RL, such that exposed portions EP are formed on edge regions of the printed circuit board 10. The presence of the exposed portions EP results in a smaller semiconductor chip packaging area.

Figure 3:
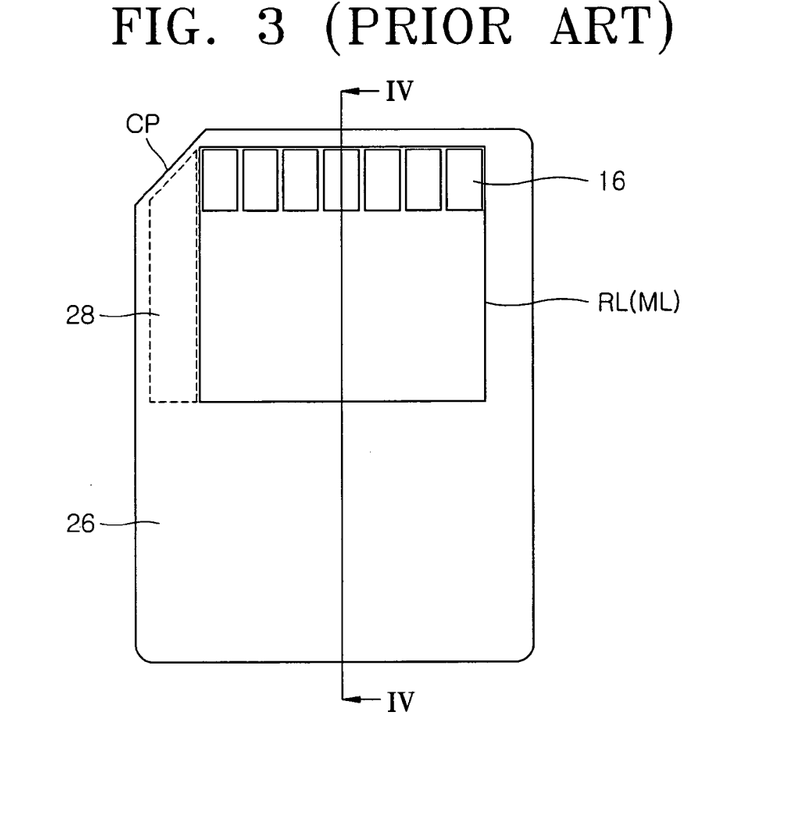
FIG. 3 is a plan diagram illustrating another conventional memory card.
Figure 4:
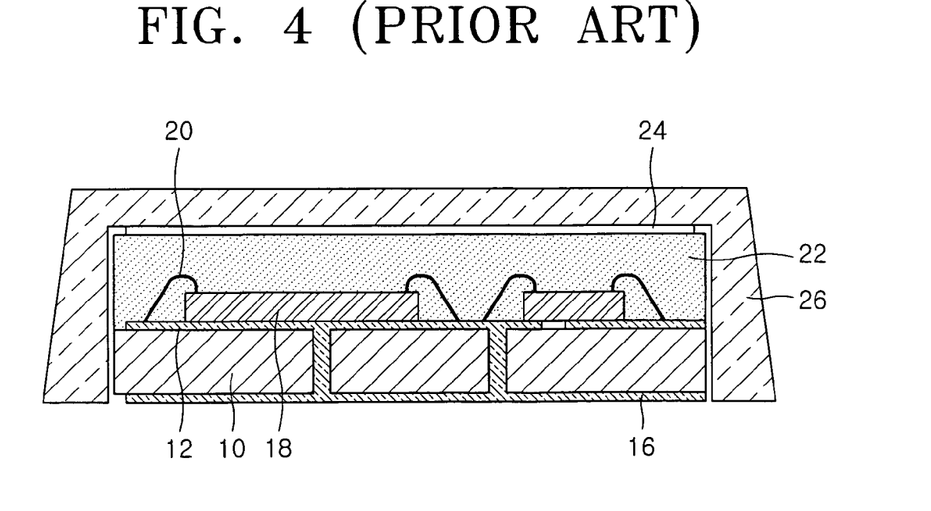
FIG. 4 is a sectional diagram taken along the line IV-IV in FIG. 3, further illustrating the conventional memory card of FIG. 3.

FIG. 3 is a plan diagram illustrating another conventional memory card. FIG. 4 is a sectional diagram taken along the line IV-IV in FIG. 3, further illustrating the conventional memory card of FIG. 3.

In FIGS. 1-4, like numbers denote like elements, so a duplicative description of elements in FIGS. 3 and 4 that are the same as elements in FIGS. 1 and 2 will not be repeated.

Referring to FIGS. 3 and 4, the line RL, indicating the extent of the encapsulant 22, and the line ML, indicating the extent of the printed circuit board 10, are aligned with each other. Therefore, unlike the memory card illustrated in FIGS. 1 and 2, exposed portions EP are not formed on edge regions of the printed circuit board 10. The absence of the exposed portions EP results in an increase in the semiconductor chip packaging area. In addition, the printed circuit board 10 in FIGS. 3 and 4 can be manufactured at low costs compared to the printed circuit board 10 illustrated in FIGS. 1 and 2. Therefore, the productivity of the memory card illustrated in FIGS. 3 and 4 is higher.

However, the use of the memory card illustrated in FIGS. 3 and 4 is limited due to the difficulty involved in manufacturing the chamfered portion CP. Furthermore, a pad cannot be formed in a portion 28 of the base card 26 that is adjacent to the chamfered portion CP.

Embodiments of the invention address these and other disadvantages of the conventional art.

SUMMARY

According to embodiments of the invention, a semiconductor package suitable for complex portions, such as a chamfered portion, may be easily processed and a semiconductor chip packaging area can be increased. According to embodiments of the invention, the semiconductor package may be included in a memory card. According to embodiments of the invention, a mold is used to fabricate the semiconductor package or the memory card that includes the semiconductor package.

BRIEF DESCRIPTION OF THE DRAWINGS

The above and other features and advantages of the invention are described below in further detail with reference to the following drawings.

DETAILED DESCRIPTION

The invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions may be exaggerated for clarity.

Figure 5:
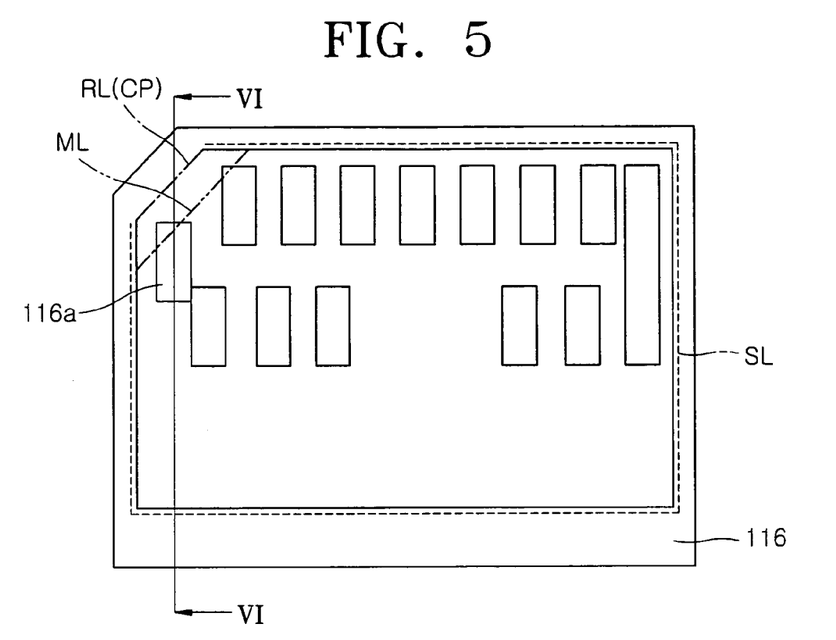
FIG. 5 is a plan diagram illustrating a memory card according to some embodiments of the invention.
Figure 6:
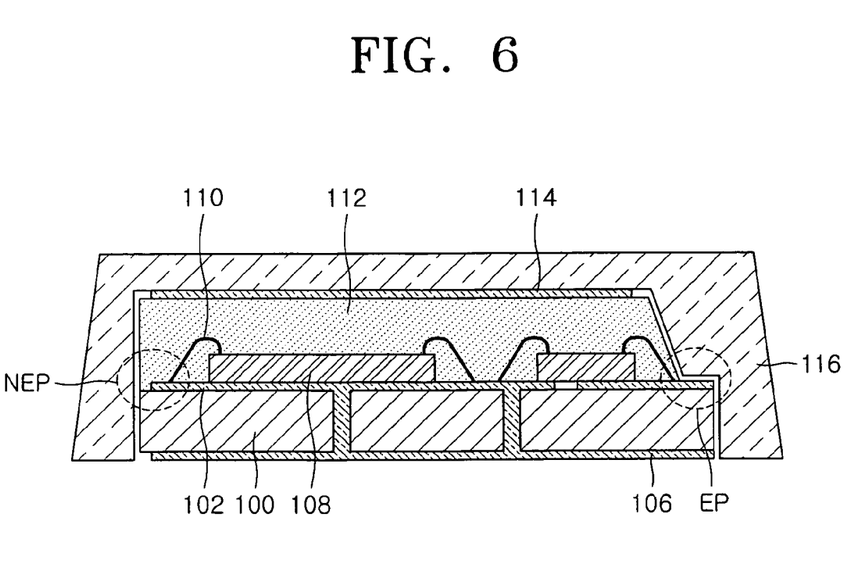
FIG. 6 is a sectional diagram taken along the line VI-VI in FIG. 5, further illustrating the memory card of FIG. 5.

FIG. 5 is a plan diagram illustrating a memory card according to some embodiments of the invention. FIG. 6 is a sectional diagram taken along the line VI-VI in FIG. 5, further illustrating the memory card of FIG. 5.

Referring to FIGS. 5 and 6, a semiconductor package of a memory card includes a semiconductor chip 108 mounted on a printed circuit board 100, a wire 110 that electrically connects the printed circuit board to the semiconductor chip, and an encapsulant 112 for protecting the semiconductor chip, the printed circuit board, the wire, or other components.

The semiconductor chip 108 is mounted on the printed circuit board 100. As shown in FIG. 6, the semiconductor package according to these embodiments includes two semiconductor chips 108, but this does not limit the invention as there may be fewer or more semiconductor chips 108. The semiconductor chips 108 are electrically connected to the printed circuit board 100 through the wire 110 and a circuit interconnection 102 composed of a conducting material formed on a surface of and through the printed circuit board 100. The encapsulant 112 is formed on the semiconductor chip 108 and the printed circuit board 100 and covers the wire 110, thus forming a semiconductor package.

Individual packages may be made in a packing process by cutting along a cutting line SL, shown in FIG. 5.

The circuit interconnection 102 is connected to an external device (not shown) through a pad 106 formed on a lower surface of the printed circuit board 100. A plurality of pads 106 may be used. The semiconductor package, including the semiconductor chip 108 disposed on the printed circuit board, the wire 110, and the encapsulant 112, is adhered to a base card 116 by an adhesive 114, thus forming the memory card. The base card 116 covers and surrounds the semiconductor package, thus protecting the semiconductor chip 108 and the printed circuit board 100.

The sectional surfaces of the printed circuit board 100 of the memory card or the semiconductor package are vertical. The encapsulant 112 of the memory card or the semiconductor package covers the edge region of the printed circuit board 100, thus forming a non-exposed portion NEP where the surface of the printed circuit board 100 is not exposed. On the other hand, the encapsulant 112 does not cover the other edge region of the printed circuit board 100, thus forming an exposed portion EP that exposes the surface of the printed circuit board 100.

Of the external structure of the semiconductor package of the memory card, only a chamfered portion CP shown in FIG. 5 is formed when the printed circuit board 100 is manufactured. That is, the chamfered portion CP forms an outer line RL of the printed circuit board 100. Therefore, the printed circuit board 100 of the memory card according to these embodiments may be manufactured more cheaply than the conventional printed circuit board 10 of the memory card illustrated in FIGS. 1 and 2.

The encapsulant 112 of the semiconductor package of the memory card is formed inside a line ML, that is, inside the line RL. Therefore, the exposed portion EP is formed only on an edge region of the printed circuit board 100. In other words, a boundary between the exposed portion EP and the encapsulant 112 is separated a predetermined distance from a side surface of the edge region of the printed circuit board 100. Therefore, according to these embodiments, the packaging area for the semiconductor chip 108 of the memory card is greater than that of the memory card illustrated in FIGS. 1 and 2.

In addition, according to these embodiments, the memory card may be used even when a pad 116a must be formed adjacent to the chamfered portion CP of the printed circuit board 100. Therefore, the memory card may contain advantages of both the memory card of FIGS. 1 and 2 and the memory card of FIGS. 3 and 4.

FIGS. 7 through 11 are plan diagrams illustrating a method of manufacturing a memory card according to some embodiments of the invention.

Figure 7:
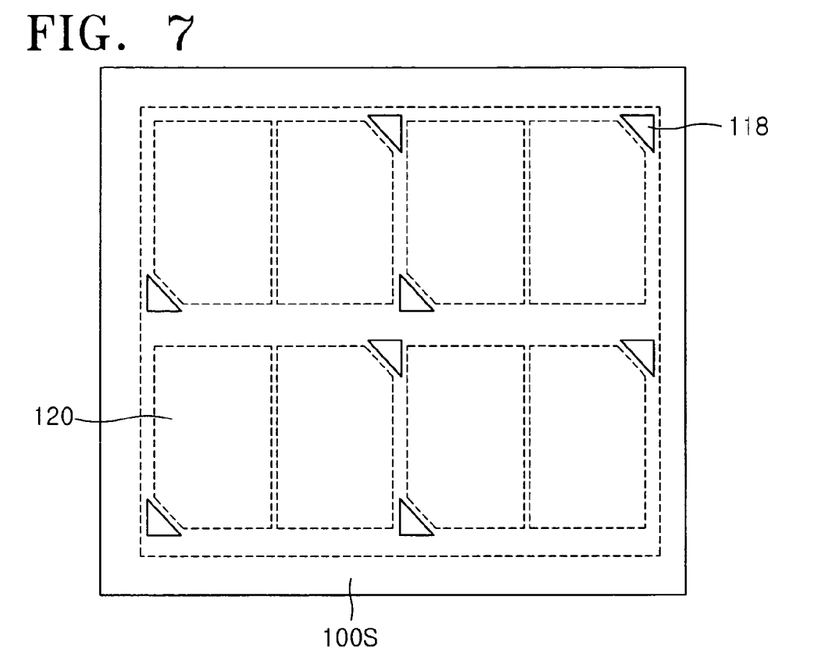
FIGS. 7 through 11 are plan diagrams illustrating a method of manufacturing a memory card according to some embodiments of the invention.

FIG. 7 is a plan diagram illustrating a portion of a printed circuit board strip 100S. The printed circuit board strip 100S includes a plurality of unit printed circuit boards 120. A slit portion 118 is formed at an edge of each of the unit printed circuit boards 120 where a chamfer is to be formed in a subsequent process. The slit portion 118 is formed prior to the processing of the unit printed circuit boards 120. A semiconductor chip (not shown) is mounted on each of the unit printed circuit boards 120 shown in FIG. 7.

Figure 8:
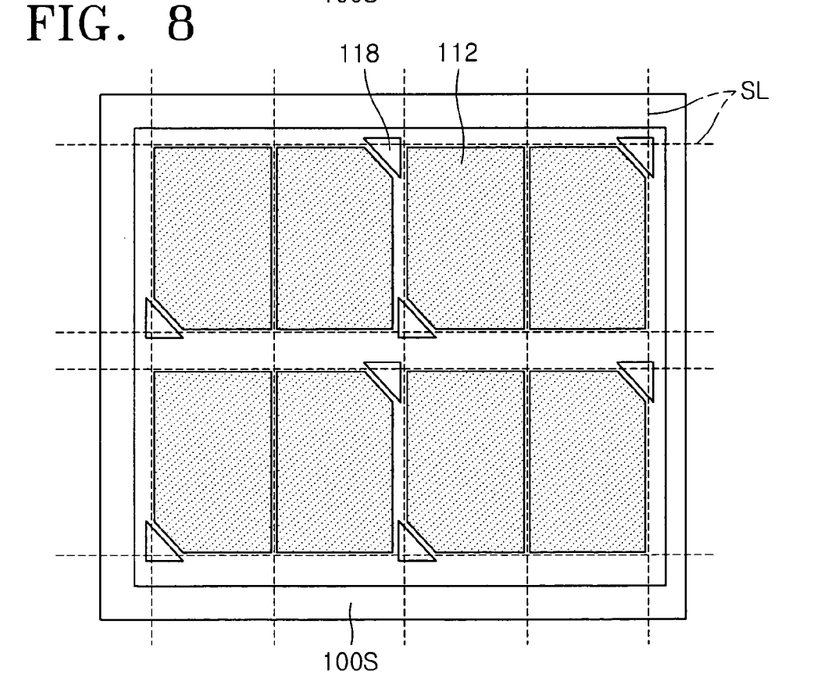

Referring to FIG. 8, an encapsulant 112 is disposed on the printed circuit board strip 100S. The encapsulant 112 is disposed on each of the unit printed circuit boards 120, but not on the slit portions 118. Subsequently, after the semiconductor chip or the encapsulant 112 is completely formed, the printed circuit board strip 100S is cut along the cutting lines SL that extend in horizontal and vertical directions, thus obtaining individual semiconductor packages.

Figure 9:
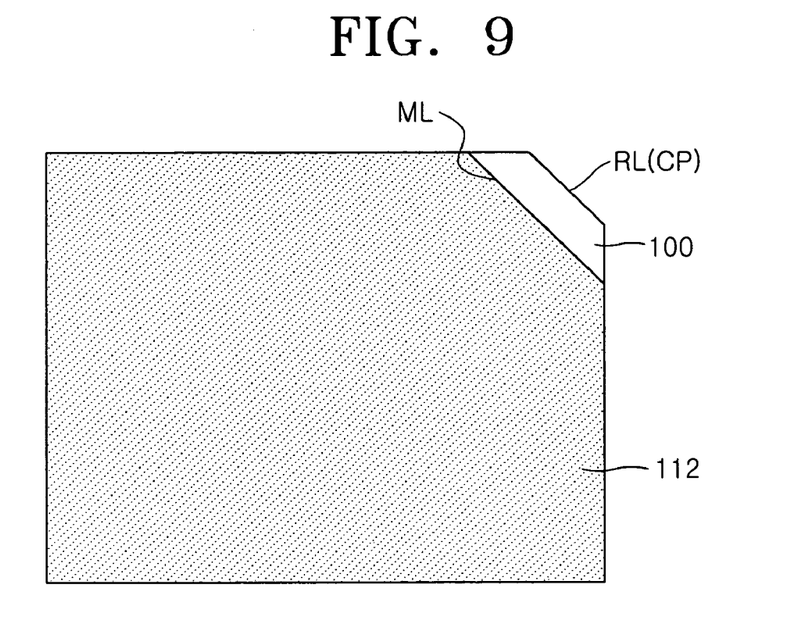
Figure 10:
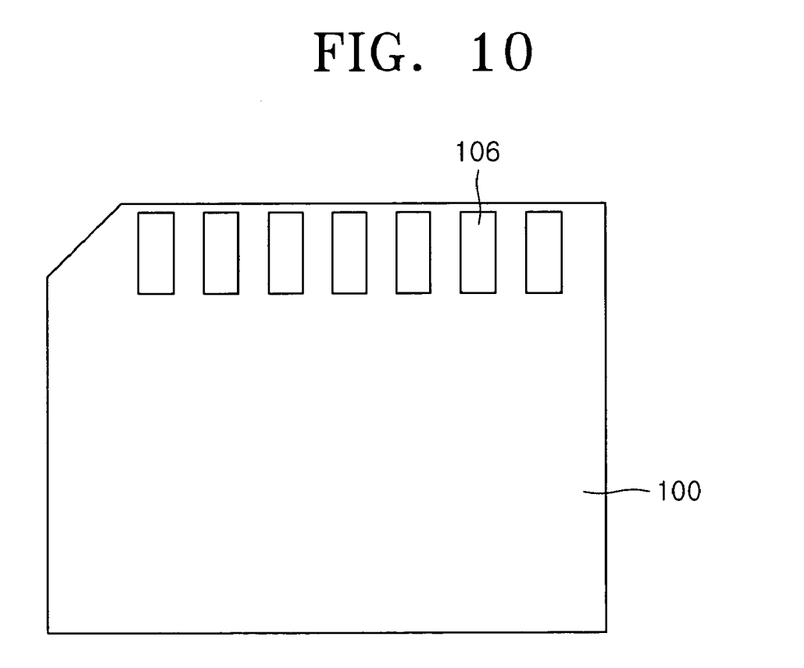

FIG. 9 is a plan diagram illustrating an upper surface of an individual semiconductor package, and FIG. 10 is a plan diagram illustrating a lower surface of the individual semiconductor package.

Referring to FIG. 9, the encapsulant 112 is disposed on a portion of the upper surface of the individual semiconductor package, and a chamfered portion CP that exposes the printed circuit board 100 corresponds to the exposed portion EP of FIG. 6. The chamfered portion CP forms an outer line RL of the printed circuit board 100.

Referring to FIG. 10, in the lower surface of the individual semiconductor package, the printed circuit board 100 is exposed and a plurality of pads 106 are formed. The pads 106 have an arrangement and a shape that are different from the pads of FIG. 5. Other arrangements and shapes of the pads are possible.

Figure 11:
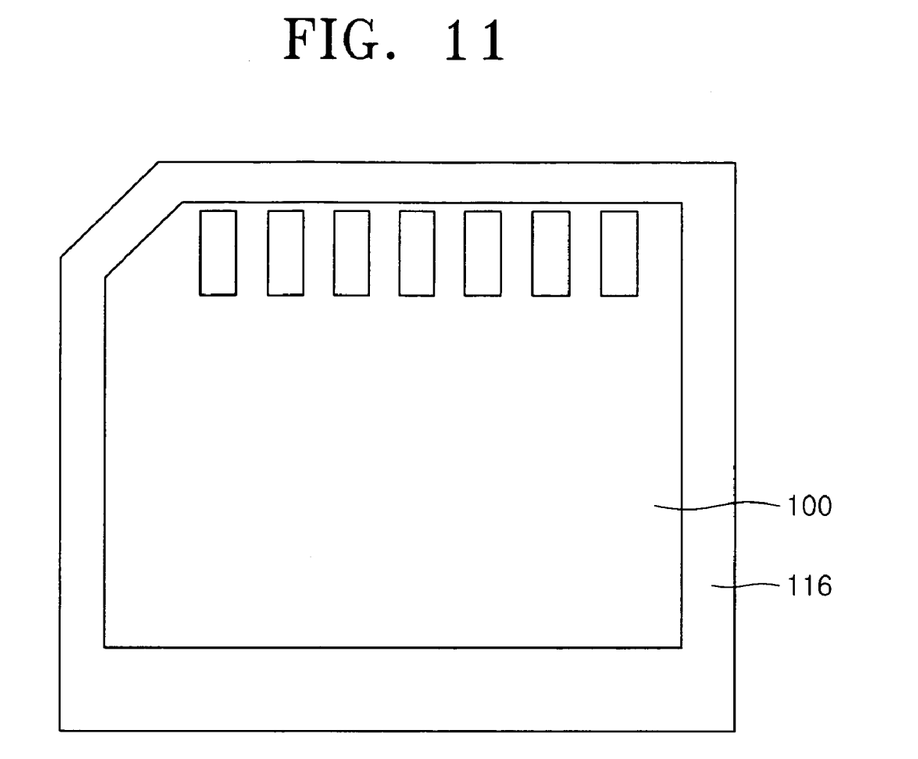

Referring to FIG. 11, the individual semiconductor package is adhered to a base card 116, completing the manufacture of the memory card.

Figure 12:
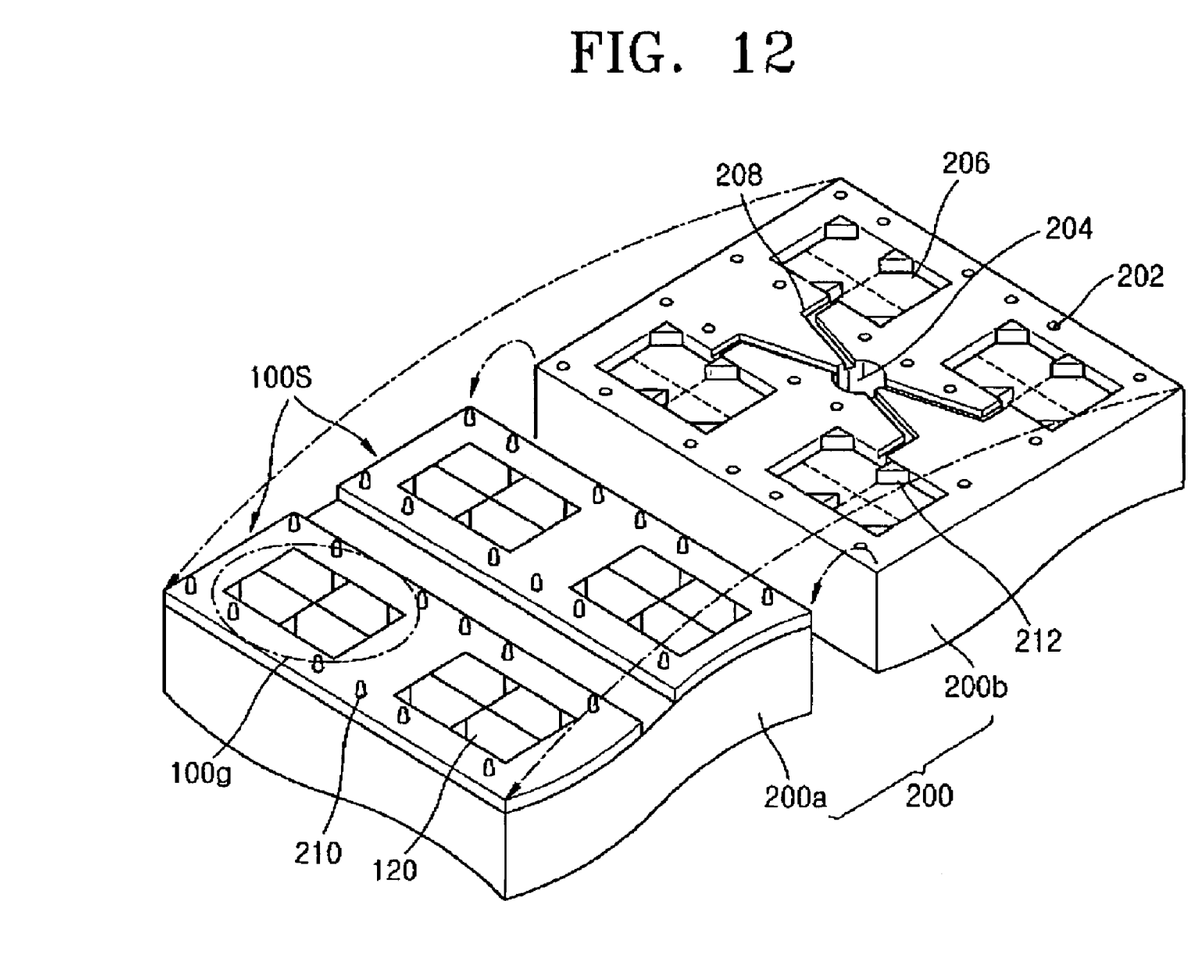
FIG. 12 is a perspective diagram illustrating a mold for manufacturing a memory card according to some embodiments of the invention.

FIG. 12 is a perspective diagram illustrating a mold 200 for manufacturing a memory card according to some embodiments of the invention.

Referring to FIG. 12, the mold 200 includes a lower mold 200a and an upper mold 200b. A printed circuit board strip 100S disposed on the lower mold 200a includes a plurality of board groups 100g. Each of the board groups 100g includes a plurality of unit printed circuit boards 120 on which semiconductor chips (not shown) are mounted.

In FIG. 12, the board group 100g includes four unit printed circuit boards 120. However, as shown in FIG. 7, the board group 100g may alternatively include eight unit printed circuit boards 120. Furthermore, the number of the unit printed circuit boards can vary according to the size of the mold 200 and each of the unit printed circuit boards 120. In FIG. 12, there are two printed circuit board strips 100S, each of which includes two board groups 100g. However, the numbers of the printed circuit board strips 100S and the board groups 100g may vary according to the size of the mold 200.

The upper mold 200b includes cavities 206 having posts 212 corresponding to the board groups 100g. The posts 212 correspond to an edge of the unit printed circuit board 120 of the board group 100g. In this case, an encapsulant is injected into the entirety of each of the cavities 206 where the posts 212 are not formed. In particular, the post 212 disposed in the cavity 206 corresponds to the chamfered portion of the unit printed circuit board 120. The encapsulant is injected into the cavity 206 via the injection holes 208. The injection holes 208 are grooves in the upper mold 200b that act as passageways for the injection of the encapsulant. The encapsulant is provided to the injection holes 208 by the port 204 that is located in the center of the upper mold 200b.

The printed circuit board strip 100S may have through holes (not shown) formed outside the board groups 100g. Fixing pins 210 mounted on the lower mold 200a are inserted into the through holes. When the lower mold 200a and the upper mold 200b are coupled to each other, the fixing pins 210 are inserted into pin holes 202 formed in the upper mold 200b and the printed circuit board strip 100S is disposed between the lower mold 200a and the upper mold 220b. At this time, the encapsulant is injected through the port 204.

As mentioned above, of the external structure of the semiconductor package of the memory card, only a chamfered portion CP is formed when the printed circuit board is manufactured. Therefore, the printed circuit board can be manufactured at low cost. A packaging process is performed later, thus increasing the packaging area of the semiconductor chip. In addition, a pad in a memory card can be formed in a portion adjacent to the chamfered portion of the printed circuit board.

A mold may be used to manufacture a memory card or a semiconductor package according to some embodiments of the invention. In particular, an upper mold according to some embodiments includes a post corresponding to a chamfered portion of a unit printed circuit board. Therefore, a semiconductor package and a memory card may be effectively manufactured.

The invention may be practiced in many ways. What follows are exemplary, non-limiting descriptions of some embodiments of the invention.

According to some embodiments, a semiconductor package includes a printed circuit board, a semiconductor chip mounted on the printed circuit board, a wire electrically connecting the printed circuit board to the semiconductor chip, and an encapsulant protecting the semiconductor chip and the wire and disposed on the printed circuit board such that the encapsulant covers one edge region of the printed circuit board but does not cover the other edge region of the printed circuit board, thus forming an exposed portion exposing the surface of the printed circuit board.

A boundary between the exposed portion and the encapsulant may be separated by a predetermined distance from a side surface of the other edge region of the printed circuit board. The wire may be electrically connected to a plurality of pads formed on a lower surface of the printed circuit board through a conductor formed in the printed circuit board. The printed circuit board may be a chamfered portion formed by cutting one of four corners of the printed circuit board.

According to some embodiments of the invention, a memory card includes a semiconductor package and a base card. The semiconductor package may include a printed circuit board, a semiconductor chip mounted on the printed circuit board, a wire electrically connecting the printed circuit board to the semiconductor chip, and an encapsulant protecting the semiconductor chip and the wire and disposed on the printed circuit board such that the encapsulant covers one edge region of the printed circuit board but does not cover the other edge region of the printed circuit board, thus forming an exposed portion exposing the surface of the printed circuit board. The base card may be adhered to the semiconductor package, thereby protecting the semiconductor chip and the printed circuit board.

The printed circuit board may have a chamfered portion formed by cutting one of four corners of the printed circuit board. The base card may have a chamfered portion, corresponding to the chamfered portion of the printed circuit portion, formed by cutting one of the four corners of the base card.

According to some embodiments of the invention, a mold includes a lower mold on which a printed circuit board strip including a plurality of board groups is mounted, each of the board groups including a plurality of unit printed circuit boards on which semiconductor chips are respectively mounted; and an upper mold, which has cavities in which posts corresponding to edges of the unit printed circuit board of the board group corresponding to the board groups and injection holes are disposed, wherein an encapsulant is injected into the cavities through the injection hole such that the encapsulant and the posts do not overlap.

Each of the unit printed circuit boards may have a chamfered portion corresponding to one of the posts. A port connected to the injection holes through which the encapsulant is injected is disposed in the center of the upper mold.

According to some embodiments of the invention, only a chamfered portion of the external structure of the semiconductor package of the memory card is formed when the printed circuit board is manufactured. The rest of the external structure is formed in a semiconductor packaging process, thus increasing the package area of the semiconductor chip. In addition, the upper mold may further have a port corresponding to a chamfered portion of a unit printed circuit board. Therefore, the semiconductor package or the memory card can be effectively manufactured.

The invention claimed is:

1. A semiconductor package comprising:
   a printed circuit board;
   a semiconductor chip mounted on the printed circuit board;
   a wire electrically connecting the printed circuit board to the semiconductor chip; and
   an encapsulant protecting the semiconductor chip and the wire, the encapsulant disposed on an upper surface of the printed circuit board such that the encapsulant covers an upper surface of one edge of the printed circuit board and exposes another upper surface of another edge of the printed circuit board,
   wherein an exposed portion in the another upper surface of another edge of the printed circuit board is a chamfered portion.

2. The semiconductor package of claim 1, wherein a boundary between the another edge of the printed circuit board and the encapsulant is separated by a predetermined distance from a vertical surface of the another edge.

3. The semiconductor package of claim 1, the wire structured to electrically connect to pads that are disposed on a lower surface of the printed circuit board with a conducting material that is disposed through the printed circuit board.

4. The semiconductor package of claim 1, wherein an edge of the chamfered portion includes an edge connecting two edges of the printed circuit board that are substantially perpendicular to each other.

5. A memory card including a semiconductor package, the semiconductor package comprising:
a printed circuit board;
a semiconductor chip mounted on the printed circuit board;
a wire electrically connecting the printed circuit board to the semiconductor chip;
an encapsulant protectively enclosing the semiconductor chip and the wire, the encapsulant disposed on an upper surface of the printed circuit board such that the encapsulant covers an upper surface of one edge of the printed circuit board and exposes another upper surface of another edge of the printed circuit board; and
a base card protectively enclosing the semiconductor chip and the printed circuit board, the base card adhered to a top surface of the encapsulant,
wherein the printed circuit board includes the upper surface, a lower surface opposite the upper surface and a plurality of side surfaces connecting the upper surface and the lower surface,
wherein the plurality of side surfaces define a perimeter of the printed circuit board, and
wherein the base card extends contiguously along each of the plurality of side surfaces from the upper surface of the printed circuit board to the lower surface of the printed circuit board around the perimeter of the printed circuit board.

6. The memory card of claim 5, a boundary between the another edge of the printed circuit board and the encapsulant is separated by a predetermined distance from a side surface of the another edge.

7. The memory card of claim 5, wherein the wire is electrically connected to pads formed on a lower surface of the printed circuit board via a conductor disposed through the printed circuit board.

8. The memory card of claim 5, the printed circuit board comprising a chamfered edge, the chamfered edge connecting two edges of the printed circuit board that are substantially perpendicular to each other.

9. The memory card of claim 8, the base card comprising a chamfered edge, the chamfered edge connecting two edges of the based card that are substantially perpendicular to each other, the chamfered edge of the base card corresponding to the chamfered edge of the printed circuit board.

10. A mold comprising:
a lower mold structured to mount a printed circuit board strip on the lower mold, the printed circuit board strip including board groups, each of the board groups including unit printed circuit boards, each of the unit printed circuit board including a semiconductor chip mounted on the unit printed circuit board; and
an upper mold including cavities and injection holes, the injection holes structured to inject an encapsulant into a corresponding cavity, the cavities including posts that correspond to an edge of a corresponding unit printed circuit board, the posts disposed so that the encapsulant does not overlap the posts.

11. The mold of claim 10, wherein the edge of the corresponding unit printed circuit board is a chamfered edge, the chamfered edge connecting two edges of the corresponding unit printed circuit board that are aligned substantially perpendicular to each other.

12. The mold of claim 10, the upper mold comprising a port disposed in the center of the upper mold, the port connected to the injection holes and configured to supply the encapsulant to the injection holes.

13. The semiconductor package of claim 4, wherein
the semiconductor chip is mounted on the upper surface of the printed circuit board,
the another edge of the printed circuit board comprises the chamfered edge, and
the edge of the printed circuit board comprises at least one of the two edges of the printed circuit board are substantially perpendicular to each other.

14. A mold of claim 10, wherein
a shape of each of the cavities corresponds to a shape of a corresponding one of the board groups, and
a location of each of the cavities within the upper mold corresponds to a location of a corresponding one of the board groups within the printed circuit board strip.

15. A mold of claim 14, wherein
each of the cavities includes a plurality of posts, and
a location of each of the plurality of posts within a cavity corresponds to a location of a corresponding one of the unit printed circuit boards within one of the board groups.

16. A memory card, comprising:
a printed circuit board having an upper surface, a lower surface opposite the upper surface and a plurality of side surfaces connecting the upper surface and the lower surface, wherein the upper surface includes a plurality of edges defined at locations where the upper surface is connected to the plurality of side surfaces;
a semiconductor chip mounted on the upper surface;
an encapsulant disposed on the upper surface and enclosing the semiconductor chip, wherein the encapsulant covers at least an upper surface of a first one of the plurality of edges and exposes at least another upper surface of a second one of the plurality of edges; and
a base card disposed on the encapsulant, the upper surface and the plurality of side surfaces.

17. The memory card of the claim 5, wherein an exposed portion in the another upper surface of another edge of the printed circuit board is a chamfered portion.

18. The semiconductor package of claim 1, wherein the encapsulant disposed on the upper surface of one edge of the printed circuit board is aligned with one edge of the printed circuit board.

19. The memory card of claim 5, wherein the encapsulant disposed on the upper surface of one edge of the printed circuit board is aligned with one edge of the printed circuit board.

* * * * *